United States Patent
Standing et al.

(10) Patent No.: US 10,032,688 B2
(45) Date of Patent: Jul. 24, 2018

(54) ELECTRONIC COMPONENT AND METHOD FOR DISSIPATING HEAT FROM A SEMICONDUCTOR DIE

(71) Applicant: Infineon Technologies Austria AG, Villach (AT)

(72) Inventors: Martin Standing, Villach (AT); Marcus Pawley, Kelsall (GB)

(73) Assignee: Infineon Technologies Austria AG, Villach (AT)

(*) Notice: Subject to any disclaimer, the term of this patent is extended or adjusted under 35 U.S.C. 154(b) by 283 days.

(21) Appl. No.: 14/324,779

(22) Filed: Jul. 7, 2014

(65) Prior Publication Data
US 2016/0005673 A1 Jan. 7, 2016

(51) Int. Cl.
*H01L 23/367* (2006.01)
*H01L 23/495* (2006.01)
(Continued)

(52) U.S. Cl.
CPC ............ *H01L 23/367* (2013.01); *H01L 21/56* (2013.01); *H01L 23/051* (2013.01); *H01L 23/3107* (2013.01); *H01L 23/3114* (2013.01); *H01L 23/36* (2013.01); *H01L 23/481* (2013.01); *H01L 23/49562* (2013.01); *H01L 23/5389* (2013.01); *H01L 24/03* (2013.01); *H01L 24/05* (2013.01); *H01L 24/19* (2013.01); *H01L 24/32* (2013.01);
(Continued)

(58) Field of Classification Search
CPC . H01L 23/367; H01L 23/051; H01L 23/5389; H01L 23/36
See application file for complete search history.

(56) References Cited

U.S. PATENT DOCUMENTS 6,819,565 B2 * 11/2004 Kao .................. H01L 23/3128
165/185
8,062,932 B2 11/2011 Hébert et al.
(Continued)

FOREIGN PATENT DOCUMENTS

| CN | 2613046 Y | 4/2004 |
| CN | 102487021 A | 6/2012 |
| CN | 103779312 A | 5/2014 |

OTHER PUBLICATIONS

NXP, "Power MosFet selection guide 2013", http://www.nxp.com/documents/selection_guide/75017357.pdf, pp. 1-60.*
(Continued)

*Primary Examiner* — Tom Thomas
*Assistant Examiner* — Vincent Wall
(74) *Attorney, Agent, or Firm* — Murphy, Bilak & Homiller, PLLC (57) ABSTRACT

In an embodiment, an electronic component includes a dielectric core layer having a thickness, at least one semiconductor die embedded in the dielectric core layer and electrically coupled to at least one contact pad arranged on a first side of the dielectric core layer, and a heat dissipation layer arranged on a second side of the dielectric core layer and thermally coupled to the semiconductor die. The semiconductor die has a thickness that is substantially equal to, or greater than, or equal to the thickness of the dielectric core layer. The heat dissipation layer includes a material with a substantially isotropic thermal conductivity.

8 Claims, 4 Drawing Sheets

(51) Int. Cl.
*H01L 23/00*    (2006.01)
*H01L 21/56*    (2006.01)
*H01L 23/31*    (2006.01)
*H01L 23/48*    (2006.01)
*H01L 23/36*    (2006.01)
*H01L 23/538*   (2006.01)
*H01L 23/051*   (2006.01)
*H05K 1/18*     (2006.01)
*H01L 23/14*    (2006.01)
*H01L 23/498*   (2006.01)

(52) U.S. Cl.
CPC ............ *H05K 1/185* (2013.01); *H01L 23/145* (2013.01); *H01L 23/49844* (2013.01); *H01L 2224/0502* (2013.01); *H01L 2224/32057* (2013.01); *H01L 2224/32245* (2013.01); *H01L 2224/73267* (2013.01); *H01L 2924/13055* (2013.01); *H01L 2924/13091* (2013.01)

(56) References Cited

U.S. PATENT DOCUMENTS

| | | | |
|---|---|---|---|
| 9,418,925 B2 | 8/2016 | Standing et al. | |
| 2004/0163843 A1* | 8/2004 | Shin | H01L 23/3135 174/254 |
| 2005/0136640 A1* | 6/2005 | Hu | H01L 23/142 438/612 |
| 2008/0116569 A1* | 5/2008 | Huang | H01L 23/36 257/712 |
| 2008/0315398 A1* | 12/2008 | Lo | H01L 23/3675 257/693 |
| 2010/0072588 A1* | 3/2010 | Yang | H01L 23/49816 257/676 |
| 2012/0111610 A1* | 5/2012 | Kim | H01L 23/3735 174/252 |
| 2012/0286414 A1* | 11/2012 | Meyer-Berg | H01L 23/13 257/698 |
| 2014/0110841 A1 | 4/2014 | Beer et al. | |
| 2014/0110858 A1 | 4/2014 | Beer et al. | |

OTHER PUBLICATIONS

Fairchild Semiconductor, TO-268AA, 2001, p. 1.*

* cited by examiner

ELECTRONIC COMPONENT AND METHOD FOR DISSIPATING HEAT FROM A SEMICONDUCTOR DIE

BACKGROUND

Semiconductor devices may generate heat during operation. Excessive amounts of heat may decrease device performance. One approach to reduce the effects of excessive heat on device performance is to provide an additional heat dissipation component which is thermally coupled to the heat generating semiconductor device and which is configured to dissipate heat away from the semiconductor device.

SUMMARY

In an embodiment, an electronic component includes a dielectric core layer having a thickness, at least one semiconductor die embedded in the dielectric core layer and electrically coupled to at least one contact pad arranged on a first side of the dielectric core layer, and a heat dissipation layer arranged on a second side of the dielectric core layer and thermally coupled to the semiconductor die. The semiconductor die has a thickness that is substantially equal to, or greater than, or equal to the thickness of the dielectric core layer. The heat dissipation layer includes a material with a substantially isotropic thermal conductivity.

In an embodiment, a method includes embedding at least one semiconductor die in a dielectric core layer, wherein the semiconductor die has a thickness that is substantially equal to, or greater than, or equal to the thickness of the dielectric core layer, electrically coupling the at least one semiconductor die to at least one contact pad arranged on a first side of the dielectric core layer and arranging a heat dissipation layer on a second side of the dielectric core layer and thermally coupling the heat dissipation layer to the semiconductor die. The heat dissipation layer includes a material with a substantially isotropic thermal conductivity.

In an embodiment, an electronic component includes means for electrically coupling at least one semiconductor die embedded in a dielectric core layer to at least one contact pad arranged on a first side of the dielectric core layer and means for dissipating heat arranged on a second side of the dielectric core layer which is thermally coupled to the semiconductor die. The semiconductor die has a thickness that is substantially equal to or greater than or equal to the thickness of the dielectric core layer. The means for dissipating heat includes a material with a substantially isotropic thermal conductivity.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1b illustrates an enlarged view of a portion of the electronic component illustrated in FIG. 1a.

FIG. 2b illustrates an enlarged portion of a contact pad of the perspective bottom view of FIG. 2a.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As used herein, when an element is referred to as being "connected" or "electrically connected" or "coupled" or "electrically coupled" to another element, it can be directly connected or coupled to the other element or intervening elements may be present. In contrast, when an element is referred to as being "directly connected" or "directly coupled" to another element, there are no intervening elements present.

As used herein, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As used herein, a "high-voltage device," such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device," such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

Figure 1A:
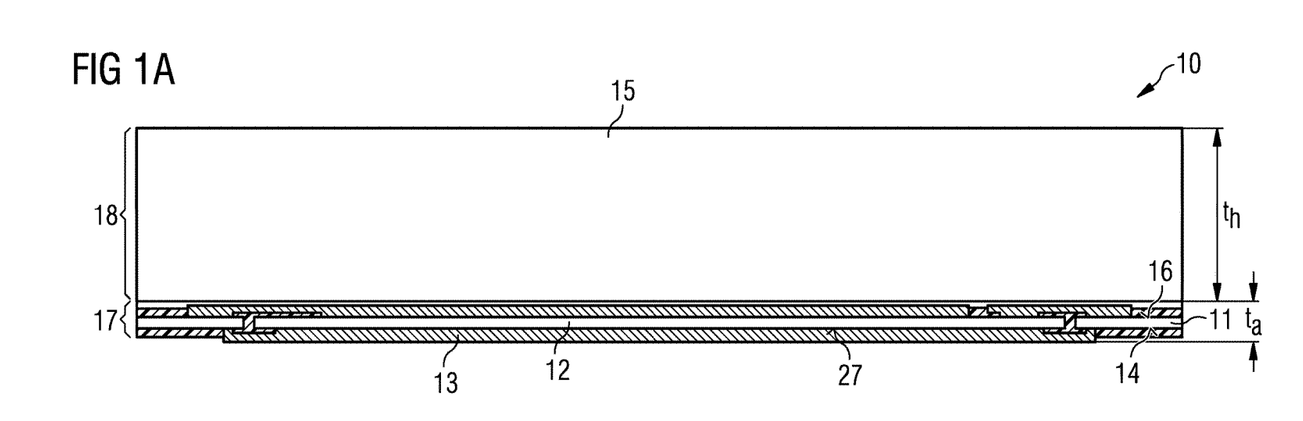
FIG. 1a illustrates a cross-sectional view of an electronic component according to a first embodiment.
Figure 1B:
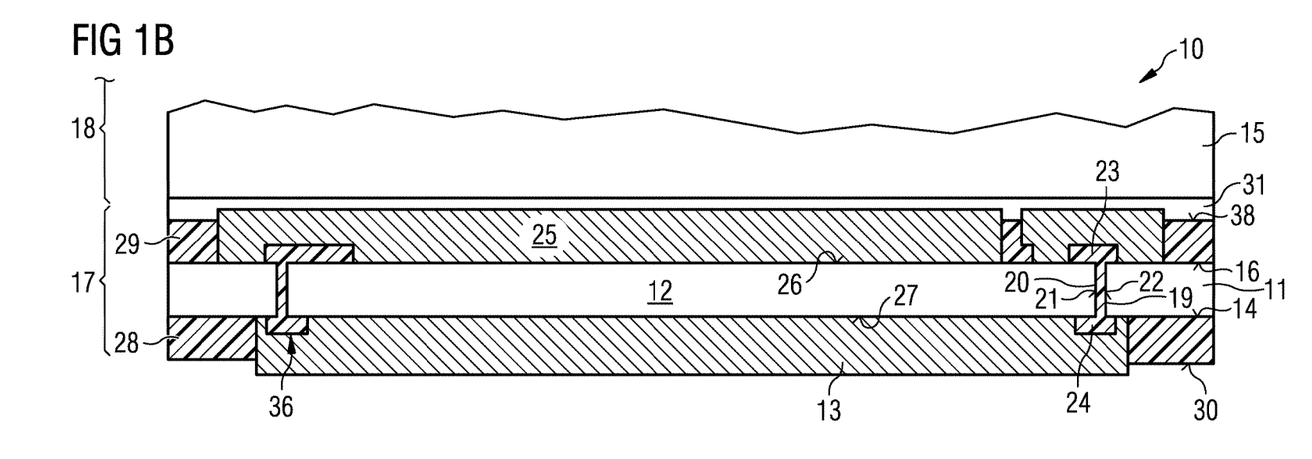
Figure 2A:
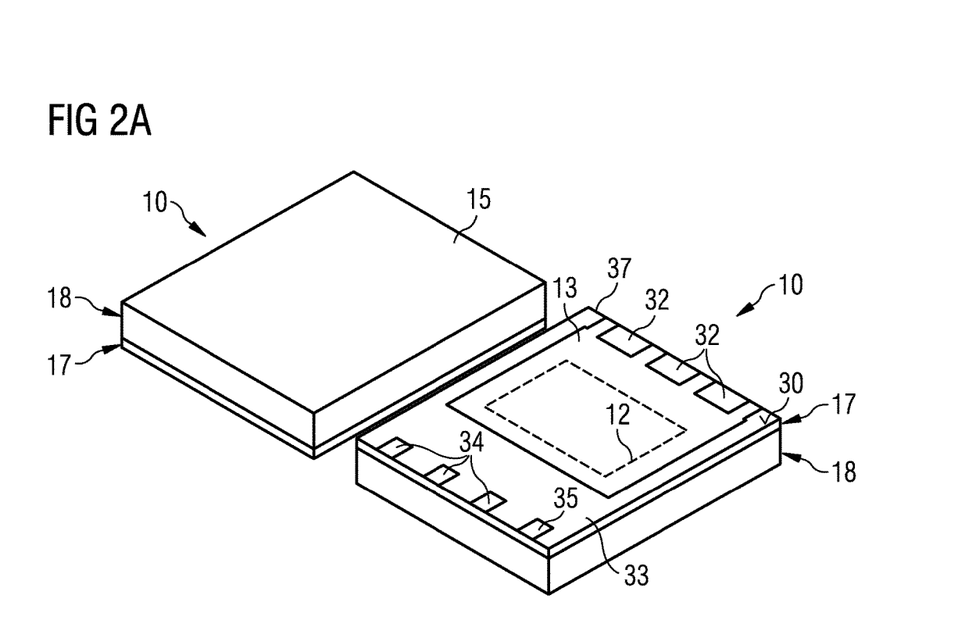
FIG. 2a illustrates a perspective top view and a perspective bottom view of the electronic component according to the first embodiment.

FIG. 1a illustrates a cross-sectional view of an electronic component 10. FIG. 1b illustrates an enlarged view of a portion of the electronic component 10 illustrated in FIG. 1a. FIG. 2 illustrates a perspective top view (top left) and a perspective bottom view (bottom right) of the electronic component 10 according to the first embodiment.

The electronic component 10 includes at least one semiconductor die 12 and a dielectric core layer 11. The semiconductor die 12 is embedded in the dielectric core layer 11 and is electrically coupled to at least one contact pad 13 which is arranged on a first side 14 of the dielectric core layer 11. The semiconductor die 12 has a thickness which is substantially equal to, or greater than, or equal to a thickness of the dielectric core layer 11. The electronic component 10 further includes a heat dissipation layer 15 which is arranged on a second side 16 of the dielectric core layer 11. The second side 16 of the dielectric core layer opposes the first side 14.

The heat dissipation layer 15 is thermally coupled to the semiconductor die 12 and includes a material having a substantially isotropic thermal conductivity. The heat dissipation layer 15 may include a metal, such as copper or aluminium, or an alloy, such as a copper alloy or an aluminium alloy, for example.

The electronic component 10 may be considered to include an active component portion 17 which is substantially planar and has a laminated structure and heat dissipation portion 18 which includes the heat dissipation layer 15. The heat dissipation portion 18 is substantially planar in this embodiment.

The active component portion 17 includes the at least one semiconductor die 12 which is/are embedded in the dielectric layer 11 and an electrically conductive redistribution structure including the at least one contact pad 13.

The heat dissipation portion 18 may have a thickness $t_h$ which is between 3 to 10 times the thickness $t_a$ of the active component portion 17, i.e. $3t_a \leq t_h \leq 10t_a$. The dielectric core layer 11 may have a thickness of between 25 µm and 500 µm. The semiconductor die 12 may have a thickness of between 25 µm and 550 µm. The active portion 17 may have a thickness $t_a$ of between 45 µm and 1000 µm. The heat dissipation portion 62 may have a thickness $t_h$ of between 100 µm and 10 mm.

The dielectric core layer 11 may include a prefabricated board, which may include a fibre reinforced matrix. For example, the dielectric core layer may include a glass fibre reinforced epoxy resin, such as FR4. The dielectric core layer may include PTFE (Polytetrafluoroethylene), PEN (Polyethylene Naphthalate), PET (Polyethylene Terephthalate, BT laminate (Bismaleimide-Triazine) or Polyimide, for example.

The dielectric core layer 11 may include an aperture 19 having an area which is configured to accommodate the area of the semiconductor die 12. The semiconductor die 12 may be secured in the aperture 19 by a layer of adhesive 20 positioned between the side faces 21 of the semiconductor die 12 and side faces 22 defining the aperture 19. The semiconductor die 12 may be further secured in the aperture 19 by the use of reinforcing layers 23, 24 of dielectric material which are positioned at the periphery of the semiconductor die 12 and extend over the layer of adhesive 20 onto the second side 16 and first side 14, respectively, of the dielectric core layer 11 and onto peripheral regions of the second surface 26 and the first surface 27 of the semiconductor die 12. The reinforcing layers 23, 24 and the layer of adhesive 20 together form a substantially I-shaped securing member 36.

The securing element 36 is not limited to having a substantially I-shape in cross-section and may have other forms. In some embodiments, the first surface 27 of the semiconductor die 12 may be covered by a dielectric layer, for example an adhesive layer. This arrangement may be used for a semiconductor die for which electrical connections to the first surface 27 are not required, for example a semiconductor die including a logic device, gate driver circuitry etc.

The semiconductor die 12 may include a vertical device such as a vertical transistor device or a vertical diode which includes at least one electrode on the first surface 27 and on the second surface 26.

The active component portion 17 may further include a first metallic layer 25 positioned on a second surface 26 of the semiconductor die and on the second surface 16 of the dielectric core layer 11. In this embodiment, the contact pad 13 arranged on the first side 14 of the dielectric layer 11 is also positioned on the first surface 27 of the semiconductor die 12. The contact pad 13 and the first metallic layer 25 are surrounded by respective dielectric layers 28, 29. The dielectric layers 28, 29 may include PEN or polyimide, for example. One or more of the contact pad 13 and metallic layers 25 may include two or more portions which are electrically insulated from one another by portions of the respective dielectric layer 28, 29.

The active component portion 17 may further include at least one electrically conductive via which is arranged in the dielectric core layer 11 and which electrically couples a portion of the metallic layer 25 to a further contact pad positioned on the first side 14 of the dielectric core layer 11. The lower surface 30 of the active component portion 17 includes the outer contact pads for the active component portion 17. The metallic layer 25 and electrically conductive via may be used to provide a redistribution structure from the second surface 26 of the semiconductor die 11 to the lower surface 30 of the active component portion 17. This arrangement may be used for embodiments in which the semiconductor die 12 includes a vertical device, such as a power transistor having a vertical drift path or a diode having a vertical drift path, which includes at least one electrode arranged on two opposing major surfaces.

The dielectric core layer 11 may further include a metallic foil bonded to at least a portion of two opposing major surfaces 14, 16 of the dielectric core layer 11. In these embodiments, the metallic foil and the dielectric core layer 11 may be provided in the form of a printed circuit board in which the metallic foil is bonded onto the dielectric core layer 11. The metallic foil may be structured to provide an arrangement suitable for providing at least a portion of the first metallic layer 25 and/or at least a portion of at least one outer contact pad.

A further metallic layer may be deposited on to the metallic foil, for example by electroplating, to electrically couple the semiconductor die 12 to a portion of a metallic foil and/or to increase the thickness of the regions of the metallic foil arranged on the dielectric core layer 11 adjacent side faces of the semiconductor die 12.

The heat dissipation portion 18 of the electronic component 10 including the heat dissipation layer 15 may be mounted on the active component portion 17 by means of an adhesive layer 31. The adhesive layer 31 may be electrically insulating or electrically conductive.

In embodiments in which one or more of the regions of the metallic layer 25, which are arranged on the second surface 16 of the dielectric core layer 11, are used to carry signals or a voltage, an electrically insulating adhesive 31 may be used to electrically insulate the heat dissipation layer 15 from the metallic layer 25. In embodiments in which the metallic layer 25 is at ground potential, an electrically conductive adhesive may be used to attach the heat dissipation layer 15 to the metallic layer 25 so as to couple the heat dissipation layer 15 to ground potential.

The heat dissipation layer 15 has an upper side and a lower side whereby at least one of the upper side and the lower side of substantially planar. In some embodiments, both the upper side and the lower side of the dissipation layer 15 are substantially planar. The heat dissipation layer 15 may include a further insulation layer on at least two opposing surfaces, for example on the upper side and the lower side.

In embodiments in which the heat dissipation layer 15 includes aluminium, the insulation layer may be provided by anodised aluminium. A freestanding aluminium plate may be anodised and then singulated to provide a plurality of heat dissipation layers 15 having the desired lateral dimensions. In these embodiments, the side faces of the heat dissipation layer 15 may include aluminium with a native aluminium oxide layer and the upper side and lower side may include a thicker anodised aluminium oxide layer. The anodised aluminium oxide layer may be used to further electrically insulate the heat dissipation layer 15 from the semiconductor die 12.

In some embodiments, at least the lower surface of the heat dissipation layer has an area that is substantially similar to the area of the dielectric core layer. The heat dissipation portion 18 and the active component portion 17 may be configured such that the electronic component 10 conforms to a JEDEC (Joint Electron Device Engineering Council) package footprint or package outline. For example, the electronic component 10 may conform to a Super SO8 or a TO268 package outline.

The lateral dimensions of the active component portion 17 and the heat dissipation portion 18 may be selected to conform to the JEDEC package outline. The electronic component 10 differs from a moulded package with a resin housing in that the electronic component fails to include a leadframe and a moulding compound providing the housing. The material providing the JEDEC package outline is largely provided by the heat dissipation layer 15. The lower surface 30 of the active component portion 17 provides the JEDEC footprint.

In the case of a semiconductor die 12 that includes a transistor device such as a MOSFET, the contact pad 13 may be electrically coupled to a drain electrode positioned on the second side 27 of the semiconductor die 12 and a source electrode and a gate electrode may be arranged on the first side 26 of the semiconductor die 12.

In some embodiments, at least upper edge regions of the heat dissipation layer 15 are embedded in a further insulation material. The further insulation material may be a dielectric material such as which is applied to the upper edge region of the heat dissipation layer 15. For example, an additional dielectric material may be applied to a peripheral recess provided in the upper edge region of the heat dissipation layer 15. In some embodiments, the heat dissipation layer 15 may be embedded in a second core layer including a fibre reinforced matrix such as a glass fibre reinforced epoxy resin.

Figure 2B:
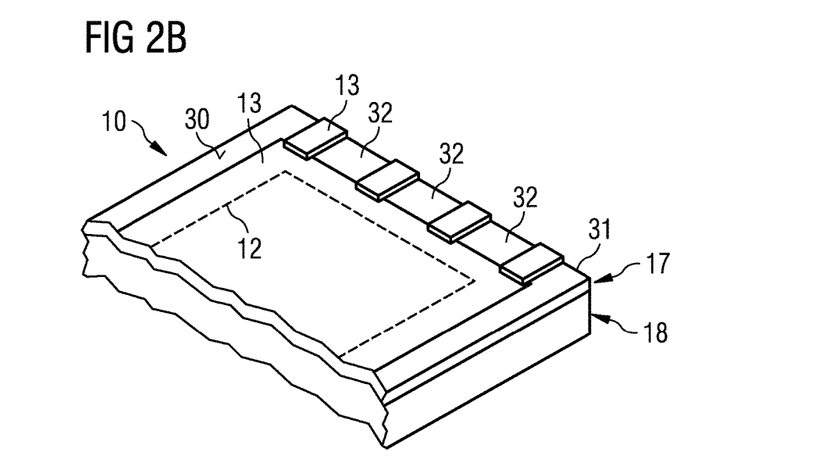

FIG. 2a illustrates (bottom right) that the lower surface 30 of the electronic component 10 includes eight contact pads arranged in the edge region of two opposing side edges of the lower side 30. The contact pad 13 which extends over the drain electrode on the lower surface 27 of the semiconductor die 12 includes four contact pads as shown in FIG. 2b extending a first edge region 37 of the lower surface 30. The four contact pads 13 are defined by three rectangular dielectric regions 32 as shown in FIG. 2b. On the opposing edge region 33 of the lower surface 30, three contact pads 34 are coupled to the source electrode and the fourth contact pad 35 is coupled to the gate electrode of the semiconductor die 12. The outer dimensions and the arrangement of the contact pads 13, 34, 35 conform to a Super SOS JEDEC package outline.

The contact pads 13, 34, 35 may include a thicker layer of metal than the remainder of the contact pad positioned on the semiconductor die 12. This is illustrated in the detailed view of FIG. 2b.

Figure 3:
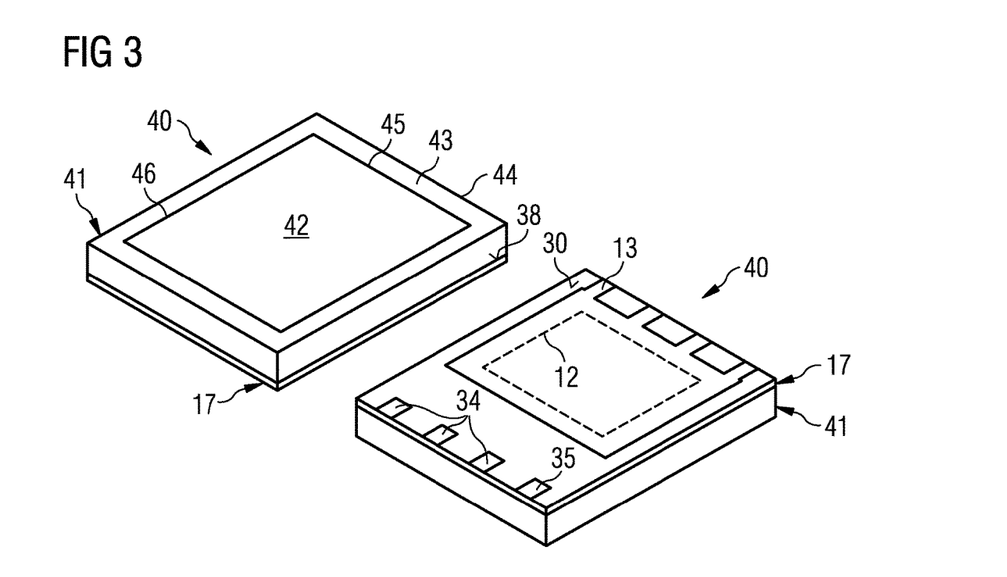
FIG. 3 illustrates a perspective top view and a perspective bottom view of an electronic component according to a second embodiment.

FIG. 3 illustrates a perspective top view (top left) and a perspective bottom view (bottom right) of an electronic component 40 according to a second embodiment. The electronic component 40 includes an active component portion 17 and a heat dissipation portion 41 mounted on the upper surface 38 of the active component portion 17. The active component portion 17 has the arrangement illustrated in FIGS. 1 and 2.

The heat dissipation portion 41 includes a heat dissipation layer 42 which is in embedded in a frame 43 provided by a second dielectric core layer 44. The heat dissipation layer 42 may include a metal, for example aluminium, which may be secured within the opening 45 of the frame 43 by a layer of adhesive 46 extending between the sidewalls defining the frame 43 and the side faces of the heat dissipation layer 42. The frame 43 provides electrical insulation for the metallic heat dissipation layer 15 and may be useful for higher voltage applications or for applications where conductive side faces and conductive upper edges of the electronic component 40 are undesirable.

Figure 4:
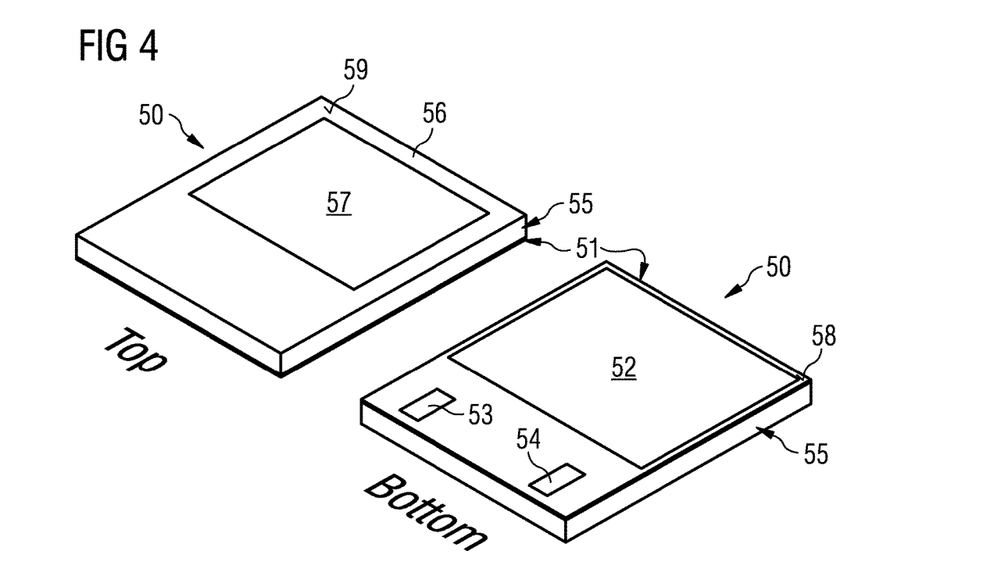
FIG. 4 illustrates a perspective top view and a perspective bottom view of an electronic component according to a third embodiment.

FIG. 4 illustrates a perspective top view (top left) and a perspective bottom view (bottom right) of an electronic component 50 according to a third embodiment. The electronic component 50 includes an active component portion 51 including a semiconductor die not seen in the views of FIG. 4 embedded in a first dielectric core layer. The lower surface 58 of the electronic component 50 formed by the lower surface of the active component portion 51 includes three contact pads 52, 53 and 54 having a size and arrangement conforming to a TO268 package outline.

The contact pad 52 has a larger area and is arranged in a first edge region of the lower side of the electronic component 50. The contact pads 53, 54 each have a smaller area and are arranged in a second edge region of the lower side of the electronic component that opposes the first edge region. In embodiments in which the semiconductor die includes a transistor device such as a MOSFET, the contact pad 52 may be coupled to the drain electrode, the contact pad 53 to a gate electrode and the contact pad 54 to a source electrode.

The electronic component 50 includes a heat dissipation portion 55 which is mounted on the upper surface of the active component portion 51. The heat dissipation portion 55 includes a second dielectric core layer 56 including an opening in which a heat dissipation layer 57 is embedded. The heat dissipation layer 57 is positioned above the semiconductor die towards an edge region 58 of the electronic component 50 and is arranged adjacent regions of the active component portion 51 on which the contact pads 53 and 54 are arranged. The heat dissipation layer 57 is, therefore, positioned asymmetrically within the lateral area of the upper side 59 of the electronic component 50. The heat dissipation layer 57 may include a metal or an alloy and has a substantially isotropic thermal conductivity.

The electronic components 10, 40, 50 each include an outer contact pad that covers the semiconductor die and is coupled to the semiconductor die. This arrangement encourages heat to be dissipated from the semiconductor die by way of this outer contact pad in addition to the heat dissipation portion. This arrangement may be used to provide an electronic component that includes heat dissipation paths from two opposing major surfaces, i.e. top and bottom major surfaces of the electronic component.

Figure 5:
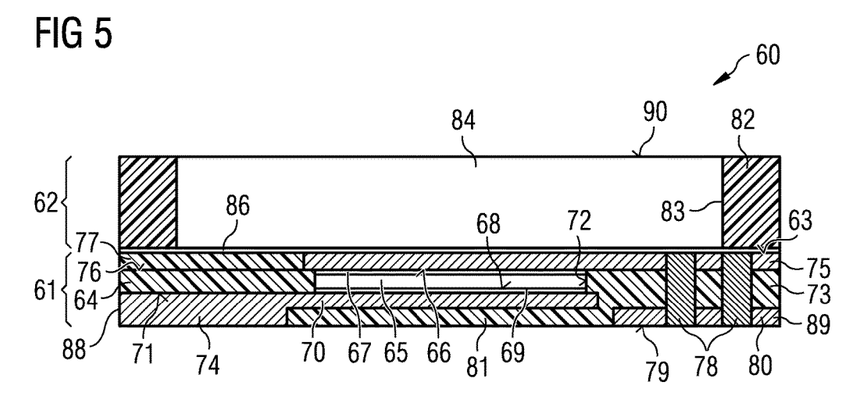
FIG. 5 illustrates a cross-sectional view of an electronic component according to a fourth embodiment.
Figure 6:
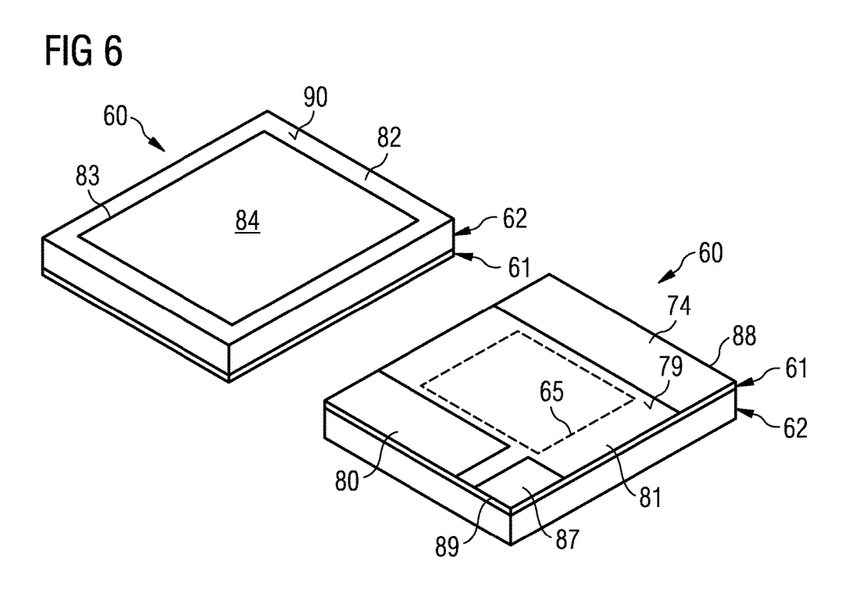
FIG. 6 illustrates a perspective top view and a perspective bottom view of the electronic component according to the fourth embodiment.

FIG. 5 illustrates a cross-sectional view and FIG. 6 a perspective top view (top left) and a perspective bottom view (bottom right) of an electronic component 60 according to a fourth embodiment.

The electronic component 60 includes an active component portion 61 and a heat dissipation portion 62 which is arranged on a first major surface 63 of the active component portion 61.

The active component portion 61 has a multilayer laminate structure and is substantially planar with a width and a breadth which is much greater than its height.

The active component portion 61 includes a dielectric core layer 64 and a semiconductor die 65 including a vertical power transistor device which is embedded in the dielectric core layer 64. The semiconductor die 65 has a thickness which is substantially equal to the thickness of the dielectric core layer 64 in this embodiment. However, the semiconductor die 65 may also have a thickness which is greater than or equal to the thickness of the dielectric core layer 64.

The dielectric core layer 64 may include a prefabricated board, for example a fibre reinforced epoxy resin board, such as FR4. The semiconductor die 65 may be embedded in the dielectric core layer 64 by forming an aperture in the dielectric core layer 64, inserting the semiconductor die 65 into the aperture and securing the semiconductor die 65 in the aperture by means of adhesive inserted into the peripheral regions of the aperture between the semiconductor die 65 and the dielectric core layer 64.

The semiconductor die 65 may include a vertical power transistor device such as a power MOSFET. The semiconductor die 65 includes a first major surface 66 which includes a first current electrode 67, for example a source electrode, and a control electrode, for example a gate electrode, which cannot be seen in the cross-sectional view of FIG. 5. The semiconductor die 65 further includes a second major surface 68 including a second current electrode 69, for example a drain electrode.

The active component portion 61 includes a first conductive layer 70 arranged on the second current electrode 69 which extends over the second major surface 68 of the semiconductor die 65 and a second major surface 71 of the dielectric core layer 64. The first conductive layer 70 may extend on a region of the second major surface 71 which is positioned adjacent a side face 72 of the semiconductor die 65. The remaining regions of the second major surface 71 of the dielectric core layer 64 are covered by a first dielectric layer 73.

A second conductive layer 74 is positioned on a peripheral region of the conductive layer 70 such that it is positioned adjacent, and peripheral to, the semiconductor die 65. The second conductive layer 74 provides an outer contact of the electronic component 60 and, in particular, an outer contact that is electrically coupled to the second current electrode 69.

The active component portion 61 includes a third conductive layer 75 which is arranged on the first major surface 66 of the semiconductor die 65 and extends onto regions of the second major surface 76 of the dielectric core layer 64 that are peripheral to at least one side face of the semiconductor die 65. In this embodiment, the third conductive layer 75 extends over a peripheral region that opposes the peripheral region on which the first conductive layer 70 is arranged.

The active component portion 61 further includes a second dielectric layer 77 arranged on the remaining portions of the second major surface 76 of the dielectric core layer 64 to provide a substantially planar first major surface 63 for the active component portion 61.

The active component portion 61 further includes one or more conductive vias 78 which extend from the third conductive layer 75 through the dielectric core layer 64 to the second major surface 79 providing the lower surface of the active component portion 61. The conductive vias 78 are electrically coupled to a fourth conductive layer 80 which provides an outer contact pad for the first current electrode and the control electrode. The outer contact pad for the control electrode cannot be seen in the cross-sectional view of FIG. 5. The fourth conductive layer 80 is arranged adjacent to and peripheral to the semiconductor die 65. The regions between the outer contact 74 and the outer contact 80 are filled with a third dielectric layer 81. The outer contacts 74, 80 may protrude from the dielectric layer 81.

The heat dissipation portion 62 of the electronic component 60 includes a second dielectric core layer 82 which may include a prefabricated board, for example a glass fibre reinforced epoxy resin board such as FR4. The second dielectric core layer 82 includes an aperture 83 in which a heat dissipating layer 84 is arranged. The heat dissipating layer 84 includes a material with a substantially isotropic thermal conductivity, such as a metal foil or plate, for example aluminium. The heat dissipating layer 84 may be secured in the aperture 83 of the second dielectric core layer 82 by the a layer of adhesive positioned at the periphery of the aperture 83 between the side faces of the heat dissipation layer 84 and the wall defining the aperture 83 in the second dielectric core layer 82.

The heat dissipation portion 62 may be mounted on the active component portion 61 by a layer of adhesive 86. The adhesive 86 may be electrically insulating in order to electrically insulate the metal heat dissipation layer 84 from the underlying first current electrode.

In other embodiments, the adhesive layer 86 may be conductive so as to electrically couple the heat dissipation layer 84 to the first current electrode 67. If the first current electrode 67 is a source electrode, the electrically conductive layer may be used to couple the heat dissipation layer 84 to ground potential.

The heat dissipation layer 84 is thermally coupled to the semiconductor die 65 since it is arranged on top of the semiconductor die 65 and is separated from the semiconductor die 65 by only a thin adhesive layer 86 and the third conductive layer 75. The arrangement of the outer contacts 74, 80 peripheral to side faces of the semiconductor die 65 and the provision of a thin first metal layer 70 on the second current electrode 69 encourages heat to be dissipated through the heat dissipation layer 84 and discourages heat to be dissipated in the opposing direction, for example through the outer contacts 74, 80.

Therefore, the arrangement of the outer contacts 74, 80 peripheral to the side faces of the semiconductor die 65 may be used to provide an electronic component 60 with improved top side cooling and reduced heat dissipation into circuit board on which the outer contacts 74, 80 are mounted. The outer contacts 74, 80 may be arranged to adjust the proportion of the heat dissipated from the top side with respect to the proportion of the heat dissipated from the upper side into the circuit board. In some embodiments, the proportion of heat dissipated from the top side may be at least twice that of the proportion dissipated into the circuit board.

As can be seen in the perspective top view illustrated in FIG. 6, the second dielectric core layer 82 provides a closed peripheral frame around a central heat dissipation layer 84. The upper surface of the heat dissipation layer 84 is exposed in the upper surface 90 of the electronic component 60. The area of the heat dissipation portion 62 corresponds to the area of the active component portion 61. The active component portion 61 and the heat dissipation portion 62 each have a substantially planar form.

As can be seen in the perspective bottom view of the electronic component 60 illustrated in FIG. 6, the outer contact 80 electrically coupled to the first current electrode 67, the outer contact 74 electrically coupled to the second current electrode 69 and the outer contact 87 electrically coupled the control electrode are positioned adjacent the semiconductor die 65 such that they do not cover the semiconductor die 65.

In this particular embodiment, a single contact pad 74 is provided for the second current electrode which extends over the substantially the entire edge region 88 of the second major surface 79 of the active component portion 61. However, other arrangements of the outer contact 74 may also be used, for example, two or more outer contacts may be provided which are electrically coupled by a further conductive layer positioned within the electronic component 61, for example by the first conductive layer 70.

The outer contact 80 coupled to the source electrode has a larger lateral area than the outer contact 86 coupled to the control electrode. In this particular embodiment, the outer contact 84 coupled to the first current electrode and the outer contact 86 coupled to the control electrode are positioned on the opposing peripheral edge region 89 of the active component portion 61 to the outer contact 74. However, other arrangements may be used in which the outer contacts are arranged on one, three or four peripheral regions to the semiconductor die 65.

The semiconductor die may include a transistor device, such as a power transistor device having a vertical drift path. The power transistor device may include a MOSFET, an Insulated Gate Bipolar Transistor (IGBT) or a Bipolar Junction Transistor (BJT). For MOSFET devices, the first current electrode may be a source electrode, the control electrode may be a gate electrode and the second current electrode may be a drain electrode. For IGBT devices, the first current electrode may be an emitter electrode, the control electrode may be a gate electrode and the second current electrode may be a collector electrode. For BJT devices, the first current electrode may be an emitter electrode, the control electrode may be a base electrode and the second current electrode may be a collector electrode.

In some embodiments, the electronic component includes at least one semiconductor die including a switching device comprising a vertical drift path. The switching device may be a transistor device or a diode. The electronic component is not limited to including a single semiconductor die and may also include two or more semiconductor dies, for example a transistor device, such as an IGBT and a diode, or two transistor devices.

The electronic component according to any one of the embodiments described herein may include two or more semiconductor dice which may be electrically coupled to provide a desired circuit. For example, the electronic component may include two transistor devices configured to provide a half-bridge circuit, two transistor devices configured as a half bridge circuit and a further logic device such as a gate driver circuit, a transistor device and a freewheeling diode, four transistors configured to provide a full bridge circuit etc.

Spatially relative terms such as "under," "below," "lower," "over," "upper" and the like are used for ease of description to explain the positioning of one element relative to a second element. These terms are intended to encompass different orientations of the device in addition to different orientations than those depicted in the figures.

Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:
1. An electronic component, comprising:
a dielectric core layer having a thickness;
at least one semiconductor die embedded in the dielectric core layer and electrically coupled to at least one contact pad arranged on a first side of the dielectric core layer, wherein the semiconductor die has a thickness that is substantially equal to or greater than the thickness of the dielectric core layer, and
a heat dissipation layer arranged directly on a second side of the dielectric core layer and thermally coupled to the semiconductor die, an I-shaped securing member securing the at least one semiconductor die to the dielectric core layer, the I-shaped securing member comprising reinforcing layers disposed at the periphery of the at least one semiconductor die and a layer of adhesive positioned between side faces of the semiconductor die and the dielectric core layer, wherein the heat dissipation layer comprises a material with a substantially isotropic thermal conductivity, and wherein the at least one semiconductor die is embedded in an aperture in the dielectric core layer.

2. The electronic component according to claim 1, wherein the dielectric core layer has a thickness between 25 µm and 500 µm.

3. The electronic component according to claim 1, wherein the heat dissipation layer has a top side and a lower side, wherein at least one of the top side and lower side are substantially planar.

4. The electronic component according to claim 1, the heat dissipation layer comprises an insulation layer on at least two opposing surfaces.

5. The electronic component according to claim 4, wherein the insulation layer comprises anodised aluminium oxide.

6. The electronic component according to claim 1, wherein at least the lower surface of the heat dissipation layer has a substantially similar area to the area of the dielectric core layer.

7. The electronic component according to claim 1, wherein at least one contact pad is arranged on the first side of the dielectric core layer peripheral to the at least one semiconductor die.

8. The electronic component according to claim 1, wherein at least one contact pad is arranged on the first side of the dielectric layer covering the semiconductor die.

* * * * *